United States Patent [19]

Masuda et al.

[11] 4,132,970

[45] Jan. 2, 1979

[54] POTENTIOMETER

[75] Inventors: Noboru Masuda; Shoichi Sugimoto, both of Tokyo, Japan

[73] Assignee: Denki Onkyo Company, Limited, Japan

[21] Appl. No.: 823,017

[22] Filed: Aug. 8, 1977

[30] Foreign Application Priority Data

Aug. 6, 1976 [JP] Japan .............................. 51-105065[U]

[51] Int. Cl.² ...................... H01L 43/02; H01L 43/08
[52] U.S. Cl. ................................ 338/32 R; 323/94 H; 324/252
[58] Field of Search ....................... 338/32 R, 32 H, 12; 323/94 H; 310/DIG. 3; 324/252, 251

[56] References Cited

U.S. PATENT DOCUMENTS 3,671,854  6/1972  Masuda ............................... 323/94 H
3,745,503  7/1973  Kobayashi ...................... 338/32 H X
3,988,710  10/1977  Sidor et al. ......................... 338/32 R Primary Examiner—C. L. Albritton
Attorney, Agent, or Firm—Robert E. Burns; Emmanuel J. Lobato; Bruce L. Adams

[57] ABSTRACT

A potentiometer includes a pair of magnetic resistance effect elements which cooperate with a permanent magnet carried by a rotary shaft. The shaft is supported for angular movement by a cylindrical holder formed of synthetic resin material and disposed in partial surrounding relationship and in contact with the shaft. The holder includes a cylindrical reinforcing member of metallic material embedded therein and having an axis which is aligned with the axis of the rotary shaft. The member affords reinforcement to and prevents a distortion during molding of the holder.

5 Claims, 3 Drawing Figures

POTENTIOMETER

FIELD AND BACKGROUND OF THE INVENTION

The invention relates to a potentiometer having a pair of magnetic resistance effect elements cooperating with a permanent magnet carried by a rotary shaft, and more particularly, to an improvement of a bearing holder for the rotary shaft.

A potentiometer of the kind described is used to produce a voltage signal which is a function of the angle of rotation of a system experiencing a rotational motion. The system includes its own rotary shaft, the free end of which carries a permanent magnet of solid semi-cylindrical form, for example. As the magnet moves angularly together with the shaft, the magnetic field created thereby scans alternately the sensor surface of a pair of magnetic resistance effect elements which are disposed in opposing relationship with the free end of the shaft with a clearance therebetween. If the individual sensor surfaces are of an arcuate form of an equal width and are arranged annularly about the axis of the shaft so as to form a circular band, a change which occurs in the area of the sensor surfaces of the elements exposed to the magnetic field will be proportional to a change in the angle of rotation of the shaft. Hence, a proportional change in the resistance of the respective elements will result. The pair of elements are connected in series across a d.c. source, and the potential at the junction between the elements will vary proportionally as the resistance of the elements changes, thus producing an output which represents a linear function of the angle of rotation of the shaft.

When an oscillation is imparted to the shaft of the potentiometer during its angular movement, the area of the elements exposed to the magnetic field of the magnet which is carried by the shaft is influenced thereby, causing a distortion in the output response of the elements. It is thus seen that the shaft must be machined with a high accuracy and properly positioned and supported by precision bearings in order to assure a selected output response. In the prior art practice, at least a pair of precision ball bearings are axially spaced within a holder for supporting the shaft. The bearings represent a large proportion of the product cost and an increase in the number of assembling steps, thus preventing the provision of inexpensive products. An attempt has been made to avoid this difficulty by providing a cylindrical holder formed of a synthetic resin having abrasion and heat resistance and which directly supports the shaft of the potentiometer without the interposition of the ball bearings. However, the attempt resulted in a failure because of the wall thickness on the order of at least 5 mm of the holder which is required to achieve a desired strength, but which caused a distortion when the resin is set during the molding process to produce unevenness of the internal surface or an inner diameter at the both ends which is greater than the inner diameter at an intermediate position along the length.

SUMMARY OF THE INVENTION

It is an object of the invention to provide a potentiometer having a holder which accurately supports a rotary shaft without the use of ball bearings.

It is a more specific object of the invention to provide a potentiometer which is simple in construction and easy to assemble, thus reducing the cost thereof.

In accordance with the invention, there is provided a potentiometer comprising a rotary shaft having its one end connected with a system experiencing a rotational motion, a cylindrical holder formed of a synthetic resin material and partially surrounding the rotary shaft and supporting it for angular movement, a pair of magnetic resistance effect semi-conductor elements disposed in opposing relationship with the other end of the shaft with a clearance therebetween, a permanent magnet carried by the other end of the shaft and producing a magnetic field which alternately operates on the pair of elements as the shaft moves angularly, and a cylindrical reinforcing member of a metallic material and having an axis which is aligned with the axis of the shaft, the reinforcing member being embedded within of the holder, the inner surface of the holder serving as a bearing surface for the shaft.

In a preferred embodiment of the invention, there is provided a cap of a metallic material which encloses the other end of the shaft, the permanent magnet and the pair of elements in spaced relationship therefrom. The reinforcing member has a flange which extends out of the holder and which is connected with the cap to form a housing therewith which functions as a magnetic or electrostatic shield.

DESCRIPTION OF PREFERRED EMBODIMENT

Figure 1:
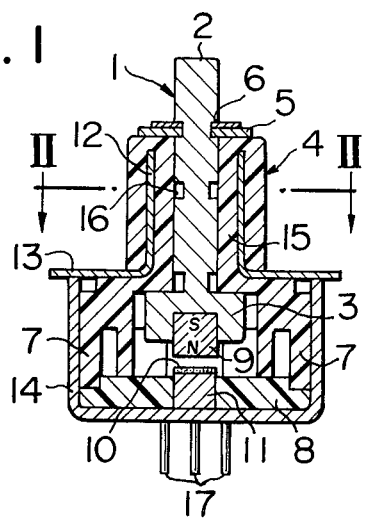
FIG. 1 is a longitudinal section of the potentiometer of the invention.
Figure 2:
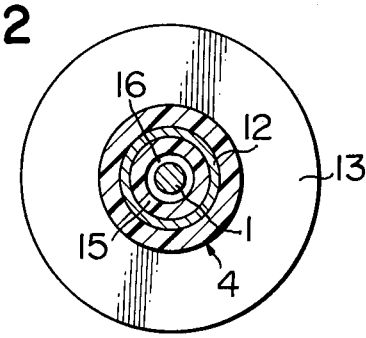
FIG. 2 is a cross section taken along the line II—II shown in FIG. 1.

Referring to FIG. 1, the potentiometer of the invention includes a rotary shaft 1 of a non-magnetic material, one end 2 of which is adapted to be connected with a system, not shown, experiencing a rotational motion and the other end 3 of which is formed as a mount to carry a permanent magnet 9. The intermediate portion of the rotary shaft 1 is closely surrounded by a cylindrical holder 4 of a synthetic resin material, the lower end of which bears against a shoulder of the shaft defined by the mount 3. A washer 5 carried by the upper end of the holder 4 fits in an annular groove 6 formed in the shaft, thus supporting it for angular movement while preventing its axial displacement. A plurality of limbs 7 extend from the lower end of the holder 4 and carry a baseplate 8 of non-magnetic material, which in turn supports a yoke 11 of a magnetic material having a pair of magnetic resistance effect semiconductor elements 10 mounted on the surface thereof. The elements are closely spaced from and opposed to a permanent magnet 9 carried by the mount 3.

The pair of elements 10 cooperate with the magnet 9 to produce a voltage signal which is a function of the angle of rotation of the shaft 1 in a manner well known in the art. Briefly, the permanent magnet 9 may be semi-circular in configuration and is carried by the shaft 1 so that the center of the circle is aligned with the axis of the shaft 1. The magnet 9 is axially magnetized to produce a magnetic field which is directed toward the yoke 11. The pair of elements 10 are disposed on the yoke 11 in a manner such that they are situated symmetrically on the opposite sides of an imaginary line which is perpendicular to the axis of the shaft 1. Consequently, as the magnet moves angularly with the shaft 1, the pair of elements 10 are alternately exposed to the magnetic field produced by the magnet 9, producing a complementary change in the resistance of the elements 10.

In accordance with the invention, the holder 4 which supports the rotary shaft 1 is formed of a synthetic resin, such as polyacetal or polyolefin resin, which has an excellent abrasion and heat resistance. The holder 4 has embedded therein a reinforcing member 12 in the form of a hollow cylinder of a metallic material and having an axis which is aligned with the axis of the shaft 1. The metallic material for the reinforcing member may be a magnetic material such as pure iron or an electrically conductive material such as aluminum or nickel. In the embodiment shown, the reinforcing member 12 has a flange 13 of a substantial dimension which extends out of the holder 4 from the lower end of the member 12. The flange 13 is connected with a cap 14 of a metallic material which encloses the limbs 7 of the holder 4 and the baseplate 8, thus forming together a housing. The member 12 functions to reinforce the holder 4 and to prevent a distortion thereof during the molding step, with consequence that a holder of a reduced wall thickness but with a high dimensional precision is obtained. Thus, during the manufacture of the holder 4, the member 12 is set in position within a mold before pouring a molten charge of synthetic resin into it for molding purpose. The holder 4 has an inner portion 15 which may be regarded as a liner to the reinforcing member 12, and the portion 15 may have a thickness on the order of 1.5 to 2 mm. An annular groove or grooves 16 may be formed in the shaft 1 to contain a suitable lubricant in order to reduce the friction occurring between the liner 15 and the shaft 1.

Where the reinforcing member 12 inclusive of the flange 13 and the cap 14 are formed of magnetic materials, the resulting housing can serve as a magnetic shield effectively isolating the pair of elements 10 from the influence of external magnetic fields. Alternatively they may be formed of conductive materials to provide a housing which serves as an electrostatic shield, effectively protecting the pair of elements 10 from adverse influence of discharge of the static electricity borne by external equipments or human bodies. In either instance, the member 12 provides a combined shielding effect which is enhanced over the shielding effect achieved with the cap 14 alone as in the prior potentiometer constructions. It will be noted that the bottom of the cap 14 is provided with three terminal pins 17 which are electrically insulated therefrom and connected with the pair of elements.

Figure 3:
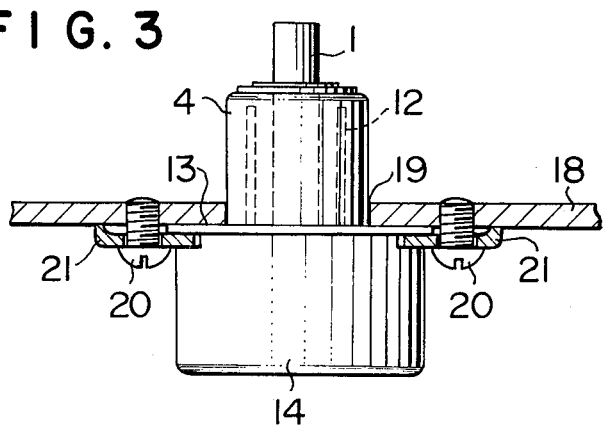
FIG. 3 is a side elevation, partly in section, of the potentiometer shown in FIG. 1 as it is mounted on a panel.

Referring to FIG. 3, the mounting of the potentiometer on a panel 18 is shown. It will be seen that the flange 13 may be advantageously utilized to mount the potentiometer by using set screws 20 which extend through clamping pawls 21 to threadably engage threaded bores in the panel when the potentiometer is partially inserted into an aperture 19 in the panel and the flange is flat against the latter.

What is claimed is:

1. A potentiometer comprising a rotary shaft having one end connectable to a system rotationally movable a cylindrical holder made of a synthetic resin material and partially surrounding the rotary shaft circumferentially and supporting it for angular movement, a pair of magnetic resistance effect semi-conductor elements disposed in opposing relationship with the other end of the shaft with a clearance therebetween a supporting member connected with the holder supporting said pair of semi-conductor elements, a permanent magnet carried by said other end of the shaft and producing a magnetic field which alternately acts on the pair of elements as the shaft moves angularly, and a cylindrical reinforcing member of a metallic material and having an axis aligned with the axis of the shaft, the reinforcing member being embedded within the holder, and the inner surface of the holder serving as a bearing surface for the shaft.

2. A potentiometer according to claim 1 in which the reinforcing member comprises a magnetic material.

3. A potentiometer according to claim 1 in which the reinforcing member comprises an electrically conductive material.

4. A potentiometer according to claim 1 in which the reinforcing member has a flange extending out of the holder.

5. A potentiometer according to claim 1, further including a cap of a metallic material enclosing said other end of the shaft, the permanent magnet and the pair of elements being disposed in spaced relationship therefrom, the reinforcing member including a flange extending out of the holder, and the flange being connected with the end of the cap.

* * * * *